United States Patent
Nakamura et al.

(10) Patent No.: US 6,730,522 B1
(45) Date of Patent: May 4, 2004

(54) METHOD OF FORMING SOLID OF A FERROELECTRIC OR HIGH DIELECTRIC MATERIAL AND METHOD OF MANUFACTURING SEMICONDUCTOR DEVICE EMPLOYING THE SAME

(75) Inventors: Takashi Nakamura, Kyoto (JP); Yoshikazu Fujimori, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/856,818

(22) PCT Filed: Nov. 22, 1999

(86) PCT No.: PCT/JP99/06524

§ 371 (c)(1),
(2), (4) Date: May 25, 2001

(87) PCT Pub. No.: WO00/32516

PCT Pub. Date: Jun. 8, 2000

(30) Foreign Application Priority Data

Nov. 27, 1998 (JP) .............................. 10-337323
Dec. 25, 1998 (JP) .......................... 10-370807

(51) Int. Cl.⁷ .............................................. H01L 21/00
(52) U.S. Cl. .............................. 438/3; 438/99; 438/795
(58) Field of Search ................................ 438/3, 46, 77, 438/93, 99, 308, 535, 572, 707, 712, 718, 725, 726, 788, 789, 790, 792, 793, 794, 795

(56) References Cited

U.S. PATENT DOCUMENTS 4,900,582 A * 2/1990 Nakayama et al. ......... 427/54.1
5,045,348 A * 9/1991 Brierley et al. ............ 427/54.1
5,156,884 A * 10/1992 Tanitsu et al. ............. 427/558

FOREIGN PATENT DOCUMENTS

| JP | 02-217337 | 8/1990 |
| JP | 03-188938 A1 | 8/1991 |
| JP | 05-85706 | 6/1993 |
| JP | 06-340487 A1 | 12/1994 |
| JP | 07-321046 A1 | 12/1995 |
| JP | 08-111411 A1 | 4/1996 |
| JP | 09-153597 | 6/1997 |
| JP | 09-208225 A1 | 8/1997 |
| JP | 10-064839 | 3/1998 |
| JP | 10-223847 A1 | 8/1998 |
| JP | 10-242404 | 9/1998 |
| JP | 10-279648 | 10/1998 |
| JP | 11-007849 | 1/1999 |
| WO | WO 96/29726 | 9/1996 |

* cited by examiner

*Primary Examiner*—David Nhu
(74) *Attorney, Agent, or Firm*—Rabin & Berdo, P.C.

(57) ABSTRACT

A method of forming a more satisfactory inorganic compound solid (ferroelectric film or the like) out of organic compound materials containing metal elements by annealing at a relatively low temperature. In order to form a ferroelectric film, a solution of organic compound materials containing metal elements is coated over a semiconductor substrate (S41) and dried (S42), after which precalcining is carried out (S43). After this process is repeated until a predetermined film thickness is achieved, organic substance removing treatment is carried out (S45). The organic substance removing treatment is carried out by, for example, heat treatment (approximately at 550° C.) in a low-pressure atmosphere (approximately at 50 Torr). Post calcining is carried out to inorganic compound materials obtained by the organic substance removing treatment (S46). The post calcining is carried out at a temperature of approximately 550° C., for example, whereby the inorganic compound materials are crystallized.

21 Claims, 14 Drawing Sheets

METHOD OF FORMING SOLID OF A FERROELECTRIC OR HIGH DIELECTRIC MATERIAL AND METHOD OF MANUFACTURING SEMICONDUCTOR DEVICE EMPLOYING THE SAME

TECHNICAL FIELD

The present invention relates to a method of forming a solid of a ferroelectric or a high dielectric material represented by a ferroelectric thin film employed in a semiconductor device, such as a ferroelectric memory. The present invention also relates to a method of manufacturing a semiconductor device, such as a ferroelectric memory.

BACKGROUND ART

A ferroelectric memory is a non-volatile storage device employing a ferroelectric film as a charge holding capacitor, and excels in high speed, low power consumption, high integration and rewriting resistance characteristics. A polarization induced by applying an electric field to the ferroelectric film remains after the electric field is lost. This makes it possible to achieve a non-volatile storage function.

FIG. 16 is a cross section showing a cell structure of the ferroelectric memory. A semiconductor substrate 1 is provided with an element forming region on its principal surface, which is isolated by a field oxide film 2, and impurity diffusion layers 3 and 4 spaced apart from each other are formed therein while a gate electrode 6 is formed on the principal surface of the semiconductor substrate 1 in the spacing between the impurity diffusion layers 3 and 4 by interposing a gate insulation film 5. In this manner, a transistor TR is formed.

The gate electrode 6 is coated by a first interlayer insulation film 7, over which a capacitor structure C such that sandwiches a ferroelectric film 10 between a lower electrode 11 and an upper electrode 12 is provided.

The upper electrode 12 is coated by a second interlayer insulation film 8. A first aluminum wire 9 formed on the second interlayer insulation film 8 is brought into contact with the upper electrode 12 and impurity diffusion layer 4 through contact holes 14 and 15, respectively, thereby electrically connecting the upper electrode 12 and impurity diffusion layer 4.

In the ferroelectric memory of this cell structure, the impurity diffusion layer 3 forms a bit line, and the gate electrode 6 and lower electrode 11 form a word line and a plate line, respectively. Hence, by applying an adequate writing voltage across the bit line (impurity diffusion layer 3) and plate line (lower electrode 11) while applying a selective voltage to the word line (gate electrode 6) so as to allow conduction in the transistor TR, an electric field can be applied to the ferroelectric film 10. Consequently, a polarization can be induced in the ferroelectric film 10 in an amount corresponding to the direction and intensity of the applied electric field.

At the time of reading, an adequate selective voltage is applied to the word line (gate electrode 6) so as to allow conduction in the transistor TR, while applying an adequate reading voltage to the plate line (lower electrode 11). A potential appearing in the bit line (impurity diffusion layer 3) at this point takes either one of two different potentials depending on the direction of the polarization in the ferroelectric film 10. Based on the foregoing, it is possible to check whether the cell is in the "1" state or "0" state.

In case that a multi-layer wiring is necessary as is shown in FIG. 16, the first aluminum wire 9 is further coated by a third interlayer insulation film 16. Then, a second aluminum wire 17 is additionally formed on the third interlayer insulation film 16, and connected to the first aluminum wire 9 through a contact hole 18. Further, the second aluminum wire 17 is coated by a protection film 19.

Generally, complex oxide ferroelectrics represented by those based on PZT (Pb(Zr,Ti)O$_3$) and those based on SBT (SrBi$_2$Ta$_2$O$_9$) are generally used as the materials of the ferroelectric film. Thin films of these ferroelectrics are formed by, for example, the sol-gel method. The sol-gel method is defined as a method of obtaining a necessary film by coating a liquid (sol) of a raw material over a substrate followed by calcining by means of annealing. In the sol-gel method of PZT, for example, a solution of organic compounds containing metal elements, that is, Pb(CH$_3$COO)$_2$.3H$_2$O, Zr(n—OC$_4$H$_9$)$_4$, and Ti(i—OC$_3$H$_7$)$_4$, in a solvent of 2-methoxy ethanol is used as a starting material. The organic compound solution is spin-coated over the substrate and dried at 150° C. to 180° C., after which precalcining is carried out for 30 minutes at 400° C. in a drying air atmosphere. This process is repeated until a predetermined film thickness is achieved, and finally, annealing at 600° C. to 700° C. is carried out to crystallize the film entirely.

However, crystallization at such high temperatures deteriorates element characteristics of the transistor TR formed beforehand, besides, mutual-diffusion of film materials at the interfaces between the ferroelectric film 10 and the upper and lower electrodes 11 and 12 causes characteristics deterioration of the ferroelectric film 10 itself. For this reason, a ferroelectric memory with satisfactory characteristics is not necessarily achieved.

The reason why the crystallization at such high temperatures is necessary is because the pre-crystallized film includes residual organic substances. Although the precalcining at a temperature of approximately 400° C. can remove the organic substances to some extent, annealing at a temperature exceeding 700° C. is necessary in order to remove the organic substances from the film in a satisfactory manner. Such a high temperature, however, causes crystallization of the film materials, thereby causing not only a loss of the purpose of the precalcining, but also more serious damages to the transistor TR formed on the semiconductor substrate 1.

Therefore, there is no conventional method of forming a ferroelectric film that has been crystallized satisfactorily by annealing at low temperatures, which makes it impossible to provide a ferroelectric memory with satisfactory characteristics.

On the other hand, because the complex oxide ferroelectrics represented by those based on PZT (Pb(Zr,Ti)O$_3$) and those based on SBT (SrBi$_2$Ta$_2$O$_9$) are oxides, they are vulnerable to a reduction atmosphere. Hence, if they undergo an interlayer insulation film forming process that uses SiH$_4$, a H$_2$ sintering process aiming at stabilizing the P—N junction or improving ohmic characteristics at a contact, etc., the capacitor characteristics may deteriorate.

To be more specific, in case of forming the cell structure shown in FIG. 16, because the second and third interlayer insulation films 8 and 16 and the protection film 19 are formed after the ferroelectric film 10 is formed, it is unavoidable for the ferroelectric film 10 to be exposed in a reduction atmosphere.

In addition, because the ferroelectrics also have the piezoelectric characteristics, they are quite sensitive to stress applied from the interlayer insulation film or protection film, thereby possibly causing biased characteristics.

Hence, the ferroelectric film 10 is under the stress applied from the upper electrode 12, second and third interlayer insulation films a and 16, first and second aluminum wires 9 and 17, and protection layer 19, all of which being formed in the steps carried out after the ferroelectric film 10 is formed, and for this reason, capacitor characteristics as designed may not be necessarily achieved.

Further, in the steps carried out after the ferroelectric film 10 is formed, etching is indispensable to pattern the upper electrode 12, first and second aluminum wires 9 and 17, etc. However, this etching causes damages to the ferroelectric film 10, which is one of the factors that deteriorate the capacitor characteristics of the ferroelectric film 10.

It has been known that the characteristics deterioration of the ferroelectric film 10 as discussed above is restorable by annealing at 550° C. to 600° C. in an oxygen atmosphere. However, annealing at such high temperatures not only causes characteristics deterioration of the transistor TR, but also melts the aluminum wires 9 and 17. Therefore, it is impossible to apply annealing at or above 400° C. once the aluminum wire 9 is formed.

As has been discussed, as to the ferroelectric film 10 employed as a capacitor film of the ferroelectric memory, there is virtually no means to restore the characteristic deterioration, and for this reason, a ferroelectric memory employing a ferroelectric film with satisfactory characteristics has not been necessarily achieved.

SUMMARY OF THE INVENTION

A first object of the present invention is to provide a method of forming a solid of a ferroelectric or a high dielectric material out of organic compound materials containing metal elements, by which a satisfactory solid of a ferroelectric or a high dielectric material can be formed by annealing at a relatively low temperature.

Also, a second object of the present invention is to provide a method of manufacturing a semiconductor device, by which a satisfactory functional thin film can be formed on a semiconductor substrate by annealing at a relatively low temperature, thereby making it possible to achieve a semiconductor device with satisfactory characteristics.

A third object of the present invention is to provide a method of manufacturing a semiconductor device, by which characteristics deterioration of a functional thin film can be restored in a satisfactory manner, thereby making it possible to manufacture a semiconductor device with excellent characteristics.

Also, a more concrete object of the present invention is to provide a method of manufacturing a semiconductor device, by which characteristics deterioration of a functional thin film can be restored by annealing at a relatively low temperature, thereby making it possible to restore characteristics deterioration of the functional thin film in a satisfactory manner.

A further concrete object of the present invention is to provide a method of manufacturing a semiconductor device capable of restoring characteristics deterioration of a ferroelectric film serving as a functional thin film.

The present invention provides a method of forming a solid of a ferroelectric or a high dielectric material by calcining organic compounds containing metal elements, comprising: a step of forming a film by coating a solution of organic compound material containing a metal element over a substrate; an organic substance removing step of removing organic substances from said film by applying organic substance removing treatment that uses means other than heat to organic compound materials containing metal elements, thereby obtaining inorganic compound material; and a crystallizing step of calcining to crystallize the inorganic compound material obtained in the organic substance removing step, thereby obtaining a solid of a ferroelectric or a high dielectric material.

According to this method, by using means other than heat, the organic substances that will become crystallization-inhibiting factors can be fully removed. Moreover, because calcining for crystallization is carried out after the organic substances have been removed, it is possible to crystallize the inorganic compound material by calcining at a relatively low temperature, thereby obtaining a solid of a ferroelectric or a high dielectric material. Consequently, mutual-diffusion of material of the solid of a ferroelectric or a high dielectric material and any other solid adjacent to the same can be prevented, and if there is a solid portion to be formed as an integral part of the solid of a ferroelectric or a high dielectric material, a thermal effect on that solid portion can be suppressed.

In other words, it is preferable that the crystallizing step is carried out at a temperature lower than a temperature, at or above which material of the solid of a ferroelectric or a high dielectric material and any other solid adjacent to the same start to diffuse each other. Likewise, it is preferable that the crystallizing step is carried out at or below a certain temperature predetermined so as to prevent a thermal effect to a solid portion to be formed as an integral part of the solid of a ferroelectric or a high dielectric material.

Said step of forming a film may include a step of performing precalcining after said solution coated on said substrate is dried.

It is preferable that the organic substance removing step includes a depressurizing step of placing the organic compound material in a low-pressure atmosphere. Accordingly, because the organic compound material is placed in a low-pressure atmosphere, evaporation of the organic substances is accelerated. As a result, the organic substances can be removed efficiently.

Also, it is preferable that heat treatment is carried out in parallel with the depressurizing step at a temperature such that does not cause crystallization. Also, it is preferable that the heat treatment in this case is carried out at a temperature lower than a temperature, at or above which materials of the organic compound material and any other solid adjacent to the same start to diffuse with each other. Likewise, it is preferable to carry out the heating treatment at a certain temperature predetermined so as to prevent a thermal effect to a solid portion to be treated together with the organic compound materials.

It is preferable that the crystallizing step is carried out after the depressurizing step. In this case, because the crystallizing step is carried out after the organic substances in the organic compound material are removed in a reliable manner by the depressurizing step, crystallization of the inorganic compound material can proceed in a satisfactory manner.

For example, the organic substance removing step including the depressurizing step, and the crystallizing step can be carried out by different treatment systems. More specifically, for example, the organic substance removing step may be carried out by a lamp heating device having a low-pressure treatment chamber, and the crystallizing step may be carried out by a heating furnace.

The depressurizing step and crystallizing step may be carried out almost simultaneously by calcining the organic compound materials in a low-pressure atmosphere.

In other words, the organic substance removing treatment and crystallization are carried out by reducing an internal pressure of the chamber of the treatment system and heating the organic compound material within the chamber. In this case, the crystallization is inhibited while residual organic substances are present in the material, and crystallization starts after the organic substances are removed and inorganic compound material is obtained. Therefore, the inorganic compound solid can be obtained by calcining at a relatively low temperature.

The advantages of this method are that two steps can be carried out successively by a single treatment system, which makes it possible to simplify the process sequence, and that the cost can be saved.

It is preferable that the organic substance removing step includes a step of giving energy other than heat to the organic compound material.

By giving energy other than heat to the organic compound material, it is possible to remove the organic substances in the organic compound material. Hence, the organic substances can be removed in a satisfactory manner without heating the organic compound material at high temperatures, and therefore, it is possible to prevent mutual-diffusion of materials of the solid of a ferroelectric or a high dielectric material and any other solid adjacent to the same, and a thermal effect to a solid portion to be formed as an integral part of the solid of a ferroelectric or a high dielectric material.

It should be appreciated, however, that thermal energy can be given to the organic compound material together with energy other than heat to the extent that the mutual-diffusion of material and thermal effect to the solid portion are the least.

The step of giving energy other than heat may include an electromagnetic wave supplying step of supplying electromagnetic waves to the organic compound material.

Examples of the electromagnetic waves include UV rays, microwaves, etc.

Besides the electromagnetic waves, the organic substance removing treatment can be carried out by giving energy to the organic compound material by activated particles, such as plasma.

Also, the step of giving energy other than heat may include a step of treating the organic compound material with activated oxygen particles.

Examples of the activated oxygen particles include ozone ($O_3$), oxygen radicals, oxygen ions ($O^{++}$, $O^+$), etc.

Bringing the organic compound material into contact with the activated oxygen particles makes it possible to give energy to the organic substances in the material, thereby achieving the organic substance removing treatment.

It is more effective when this treatment is carried out together with heat treatment or annealing to the organic compound materials. It is preferable that the annealing in this case is carried out at a temperature such that does not cause crystallization of the organic compound materials. Also, it is preferable that the annealing is carried out at a temperature such that does not cause mutual-diffusion of materials between the inorganic compound solid and any other solid adjacent to the same. Further, in case that the solid of a ferroelectric or a high dielectric material is formed together with another solid portion into one body, it is preferable that the annealing is carried out at a temperature such that a thermal effect given to the solid portion is the least.

Examples of the ferroelectric include complex oxides represented by PZT ($Pb(Zr,Ti)O_3$) and SBT ($SrBi_2Ta_2O_9$), etc. A method of manufacturing a semiconductor device of the present invention is characterized by comprising a step of forming, on a semiconductor substrate, a functional thin film made of the solid of a ferroelectric or a high dielectric material formed by the foregoing methods. The functional thin film may be a capacitor film, and the capacitor film may be made of a ferroelectric.

According to this invention, because the functional thin film can be formed by a process at a relatively low temperature, mutual-diffusion of materials between the films and a thermal effect to a functional element formed on the semiconductor substrate can be prevented, thereby making it possible to achieve a semiconductor device with satisfactory characteristics.

In other words, it is preferable that the functional thin film forming step is carried out at a temperature such that does not cause diffusion of materials at the interface of the films, and in case that the functional element is formed on the semiconductor substrate, at a temperature such that does not deteriorate the characteristics of the functional element.

It is preferable that this method includes an element forming step of forming the functional element on the semiconductor substrate before the functional thin film forming step.

In this invention, because the functional thin film can be formed by annealing at a low temperature, the characteristics of the functional element formed before the functional thin film will not be deteriorated.

It is preferable that the crystallizing step is carried out at or below a certain temperature predetermined so as not to deteriorate the characteristics of the functional element.

Consequently, deterioration of the characteristics of the functional element can be prevented in a reliable manner, thereby making it possible to achieve a semiconductor device with satisfactory characteristics.

Examples of the functional element include a transistor, such as a field effect transistor, a capacitor, a resistor, etc.

It is preferable that the crystallizing step is carried out at a predetermined temperature lower than a temperature, at or above which mutual-diffusion of materials occurs between the functional thin film and a solid adjacent to the same.

Consequently, mutual-diffusion of materials between the functional thin film and a solid adjacent to the same (other thin films or the like) can be prevented in a reliable manner, thereby making it possible to achieve a semiconductor device with satisfactory characteristics.

In case that the functional thin film is a ferroelectric thin film, it is possible to fabricate a ferroelectric storage device employing the ferroelectric thin film as a charge holding film.

According to this invention, because a ferroelectric thin film satisfactorily crystallized by annealing at a relatively low temperature can be employed as the charge holding film, a satisfactory ferroelectric storage device can be achieved. In particular, in case that a writable non-volatile storage device is realized by exploiting the polarization holding characteristics of the ferroelectrics, significant improvements are achieved in terms of inversion polarization characteristics, writable number of times, low voltage driving, etc.

Another aspect of the present invention relates to a method of manufacturing a semiconductor device comprising: a step of forming a functional thin film on a semiconductor substrate; and a restoring step of restoring characteristics deterioration of the functional thin film caused by influences during steps carried out after the functional thin film is formed, which method being characterized in that the restoring step includes: a treatment step of giving energy other than heat to the functional thin film; and a heat treatment or an annealing step of giving thermal energy to the functional thin film.

The treatment step of giving energy other than heat to the functional thin film and annealing step in the restoring step may be carried out in such a manner that the former can be carried out before the latter or vice versa. However, it is preferable to carry out the both steps simultaneously.

According to the present invention, by using energy other than heat and thermal energy together, the characteristics deterioration of the functional thin film is restored. For this reason, only a small amount of thermal energy has to be given to the semiconductor substrate in the restoring step. Consequently, a thermal effect to the portions other than the functional thin film is lessened. On the other hand, the functional thin film can be supplied with sufficient energy as both the energy other than heat and thermal energy are given. As a result, the functional thin film having undergone the restoring step can have satisfactory characteristics. In other words, characteristics deterioration of the functional thin film can be recovered in a satisfactory manner by annealing at a relatively low temperature.

The functional thin film may be a complex oxide thin film. Examples of complex oxides forming the complex oxide thin film include PZT (Pb(Zr,Ti)O$_3$) and SBT (SrBi$_2$Ta$_2$O$_9$).

The complex oxide film is caused deterioration in characteristics (in particular, capacitor characteristics) when exposed in a reduction atmosphere during an insulation film forming process or a H$_2$ sintering step. Hence, the function restoration by the restoring step discussed above is needed frequently.

The restoring step may further include an oxygen introducing step of introducing an oxidation gas to a surface of the semiconductor substrate having formed thereon the functional thin film.

The oxidation gas is a gas containing oxygen, examples of which including oxygen gas (O$_2$), ozone (O$_3$), No$_x$, etc.

It is preferable that the oxygen introducing step is carried out simultaneously with non-annealing step (treatment step of giving energy other than heat to the functional thin film), and/or annealing step.

According to this invention, the semiconductor substrate can be placed in an oxygen gas atmosphere during the restoring step of restoring the characteristics of the functional thin film. This promotes oxidation of the functional thin film with deteriorated characteristics due to exposure in a reduction atmosphere, thereby making it possible to restore the characteristics in a satisfactory manner. Hence, the oxygen introducing step is particularly effective when the functional thin film is made of the complex oxides.

The treatment step of giving energy other than heat to the functional thin film may include an oxygen activated particle treatment step of placing the semiconductor substrate having formed thereon the functional thin film in an oxygen activated particle atmosphere.

Examples of the oxygen activated particles include ozone, oxygen radicals, plasma, etc.

By placing the semiconductor substrate in the oxygen activated particle atmosphere, energy can be given to the functional thin film, thereby making it possible to restore the characteristics deterioration of the functional thin film. In particular, when the functional thin film is made of complex oxides, the damages can be restored as the oxygen in the atmosphere is activated.

In this case, it is more preferable that an oxidation gas, such as an oxygen gas, is introduced in the vicinity of the semiconductor substrate, because by so doing, the characteristics of the functional thin film can be restored more effectively.

The treatment step of giving energy other than heat to the functional thin film may include an electromagnetic wave supplying step of supplying an electromagnetic wave to the functional thin film. By supplying the electromagnetic waves to the functional thin film, it is possible to restore the characteristics of the functional thin film with a supply of energy other than heat.

Examples of the electromagnetic waves include UV rays, microwaves, etc.

The functional thin film may be a ferroelectric film. In this case, even when the capacitor characteristics and polarization characteristics of the ferroelectric film are deteriorated during various steps carried out after the ferroelectric film is formed, such characteristics deterioration can be recovered in a satisfactory manner.

The semiconductor device may be a ferroelectric storage device employing the ferroelectric film as a charge holding film.

In this case, because the capacitor characteristics and polarization characteristics of the ferroelectric film can be restored in a satisfactory manner by the restoring step, a storage device (memory) with excellent characteristics can be achieved.

The above method may further include a wiring forming step of forming a wiring on the semiconductor substrate before the restoring step.

In the restoring step of restoring the function of the functional thin film with deteriorated characteristics, both thermal energy and energy other than heat are used, and therefore, the characteristics can be recovered at a relatively low temperature. As a result, the characteristics of the functional thin film can be restored without giving damages to the wiring, thereby making it possible to achieve a semiconductor device with satisfactory characteristics.

In other words, by carrying out the annealing step such that a temperature of the semiconductor substrate does not exceed a certain temperature predetermined so as not to deteriorate the wiring, no damage is given to the wiring.

For example, in case that the wire is made of aluminum, it is preferable that the certain temperature is approximately 400° C. or below.

The method may further include an element forming step of forming a functional element on the semiconductor substrate before the restoring step.

Examples of the functional element include a transistor, such as a field effect transistor, a capacitor, a resistor, etc.

According to this invention, because the characteristics of the functional thin film can be restored at a relatively low temperature, no damage is given to the functional element that is formed before the restoring step. As a result, a semiconductor device with satisfactory characteristics can be achieved.

In other words, by carrying out the annealing step such that a temperature of the semiconductor substrate does not exceed a certain temperature predetermined so as not to deteriorate the functional element, the characteristics of the functional element will never be deteriorated.

For example, in order to protect the functional element, such as a transistor, formed on the semiconductor substrate, it is preferable that the above certain temperature is approximately 400° C. or below.

The above and other objects, features, and effects of the invention will become more apparent in the following description of embodiments with reference to the accompanying drawings.

BRIEF DESCRIPTION OF THE ACCOMPANYING DRAWINGS

BEST MODE FOR CARRYING OUT THE INVENTION

Figure 1:
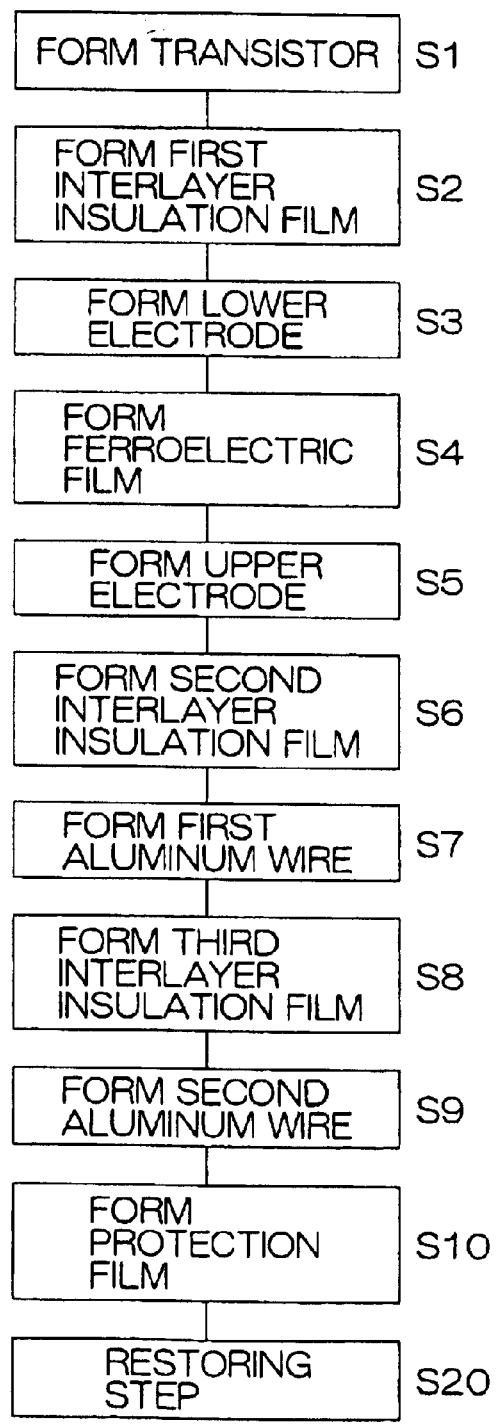
FIG. 1 is a flowchart detailing a fabrication sequence to manufacture a ferroelectric memory.
Figure 16:
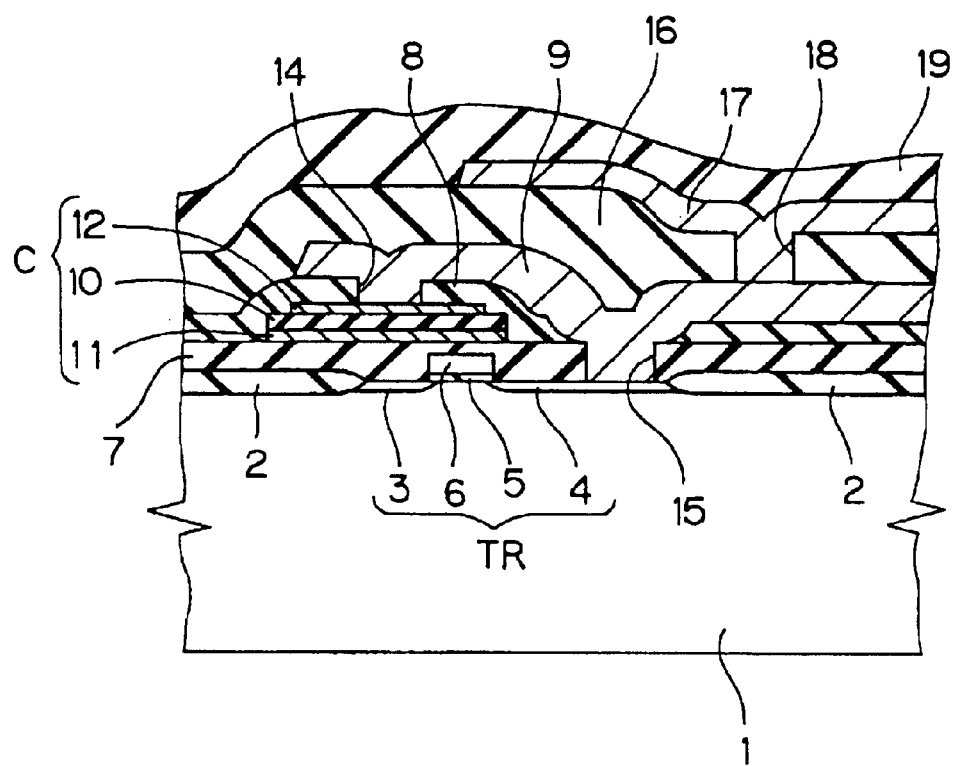
FIG. 16 is a cross sectional view showing a cell structure of a ferroelectric memory.

FIG. 1 is a flowchart detailing a fabrication sequence to manufacture a ferroelectric memory having the cell structure shown in FIG. 16. Referring to FIGS. 1 and 16, one of embodiments of the present invention will be described.

Initially, a field oxide film 2 is formed on a semiconductor substrate 1, and further, impurity diffusion layers 3 and 4, a gate insulation film 5, and a gate electrode 6 are formed, whereby a transistor TR serving as a functional element is formed (Step S1). Subsequently, a first interlayer insulation film 7 is formed so as to coat the gate electrode 6 (Step S2).

Then, in order to form a capacitor structure C, a lower electrode 11 made of $IrO_2$, for example, is formed on the first interlayer insulation film 7 above or nearly above the transistor TR (Step S3). A ferroelectric film 10 is deposited on the first interlayer insulation film 7 (Step S4), and both are patterned in the same shape.

After the ferroelectric film 10 is formed, an upper electrode 12 is formed on the ferroelectric film 10 and etched into a pattern (Step S5).

Then, a second interlayer insulation film 8 made of an insulation material, such as silicon oxide, is formed on the entire surface of the substrate by CVD (Chemical vapor Deposition) method using $SiH_4$ or the like as a raw material gas (Step S6). Then, contact holes 14 and 15 are made by etching to penetrate through the first and second interlayer insulation films 7 and 8, respectively, and as a result, the upper electrode 12 and impurity diffusion layer 4 are exposed.

Subsequently, a first aluminum wire 9 is formed by, for example, sputtering aluminum to deposit over the second interlayer insulation film 8 followed by etching into a pattern (Step S7).

Then, a third interlayer insulation film 16 made of an insulation material, such as silicon oxide, is formed on the entire surface of the substrate by CVD method using $SiH_4$ or the like as a raw material gas (Step S8). Subsequently, a contact hole 18 is made by etching so as to penetrate through the third interlayer insulation film 16 and reach the first aluminum wire 9.

Subsequently, an aluminum wire 17 is formed by, for example, sputtering aluminum to deposit over the third interlayer insulation film 16 followed by etching into a pattern, (Step S9).

Then, a protection film 19 is formed on the entire surface of the substrate (Step S10). The protection film 19 is made of silicon oxides, for example, and in this case, can be formed by CVD method using $SiH_4$ or the like as a raw material gas.

When the cell structure is fabricated in this manner, a restoring step of restoring characteristics deterioration of the ferroelectric film 10 is carried out (Step S20). The characteristics deterioration of the ferroelectric film 10 caused by influences during the steps carried out after the ferroelectric film 10 is formed has been already mentioned above, and the description is not repeated herein.

Figure 2:
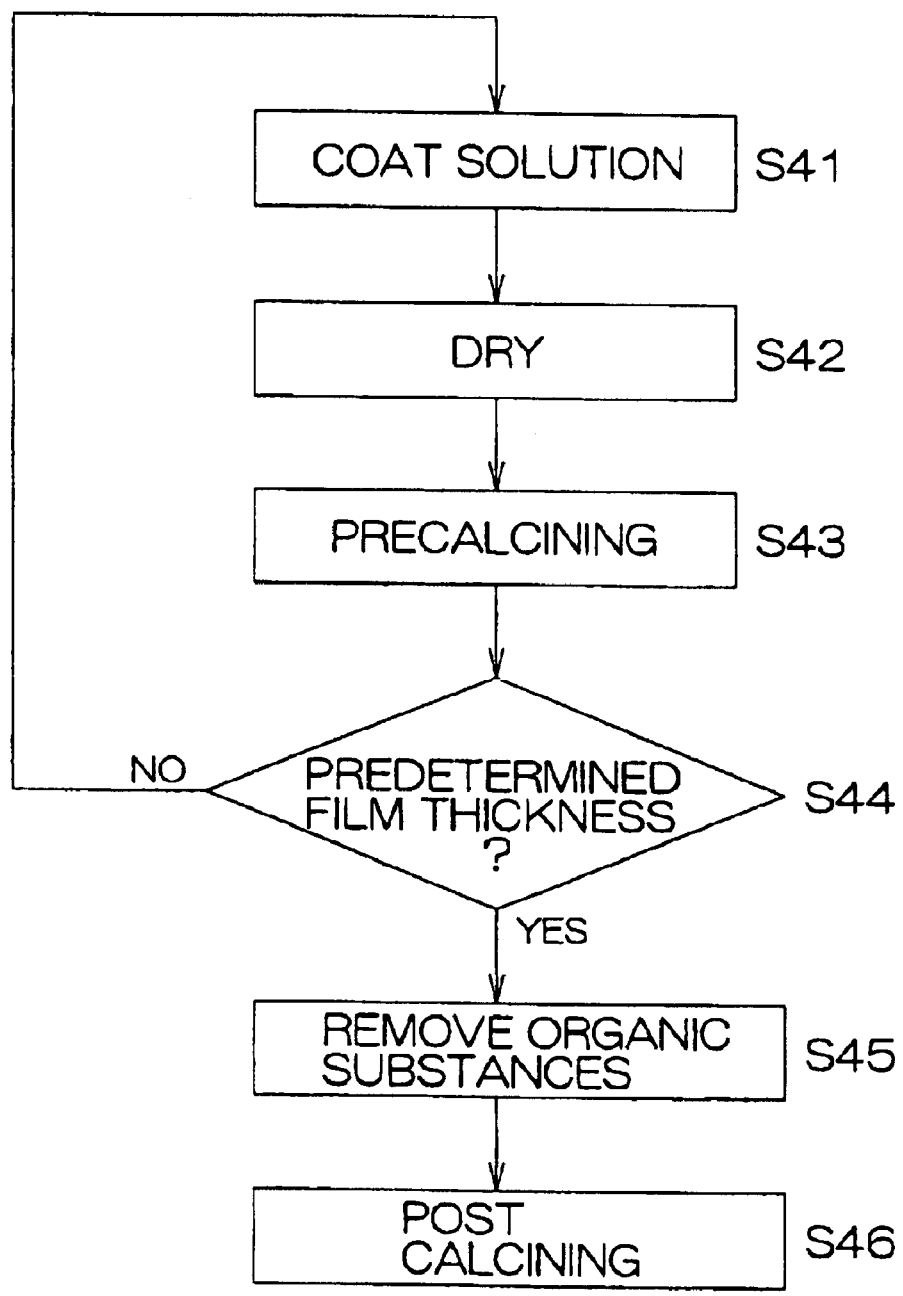
FIG. 2 is a flowchart explaining a forming step of a ferroelectric film more in detail.

FIG. 2 is a flowchart describing more in detail the step of forming the ferroelectric film 10 (Step S4). The ferroelectric film 10 is formed by the sol-gel method, for example. The sol-gel method is defined as a method of obtaining a necessary film by coating a liquid (sol) of a raw material over a substrate followed by calcining by means of annealing.

In the sol-gel method of PZT, for example, a solution of organic compound materials containing metal elements, that is, $Pb(CH_3COO)_2 \cdot 3H_2O$, $Zr(n-OC_4H_9)_4$, and $Ti(i-OC_3H_7)_4$, in a solvent of 2-methoxy ethanol is used as a starting material. The solution is spin-coated over the substrate (Step S41) and dried at 150° C. to 180° C. (Step S42), after which precalcining is carried out for 30 minutes at 400° C. (a temperature such that does not cause crystallization) in a dry air atmosphere (Step S43). This process is repeated until a predetermined film thickness is achieved (Step S44), and an organic substance removing treatment is carried out to remove organic substances from the film (Step S45). Finally, post calcining is carried out (Step S46) to crystallize the film entirely.

The organic substance removing treatment (Step S45) is carried out by annealing, for example, with a RAT (Rapid Thermal Anneal) in a low-pressure atmosphere at approximately 50 Torr and 550° C. (a temperature such that does not cause crystallization of the organic compound materials). In short, organic substances are removed from the film as they evaporate by annealing in a low-pressure atmosphere, whereby the organic substance removing treatment is achieved.

The post calcining (Step S46) of the film (a film of inorganic compound materials) having the crystallization-inhibiting organic components being removed therefrom can be achieved by annealing at a relatively low temperature, and for instance, it is possible to obtain the satisfactorily crystallized ferroelectric film 10 by annealing at approximately 550° C. Annealing at a temperature of approximately 550° C. neither has a possibility of causing deterioration of the element characteristics of the transistor TR, nor causes mutual-diffusion of materials of the ferroelectric film 10 and each film (lower and upper electrodes 11 and 12, etc.) adjacent to the same.

Figure 3:
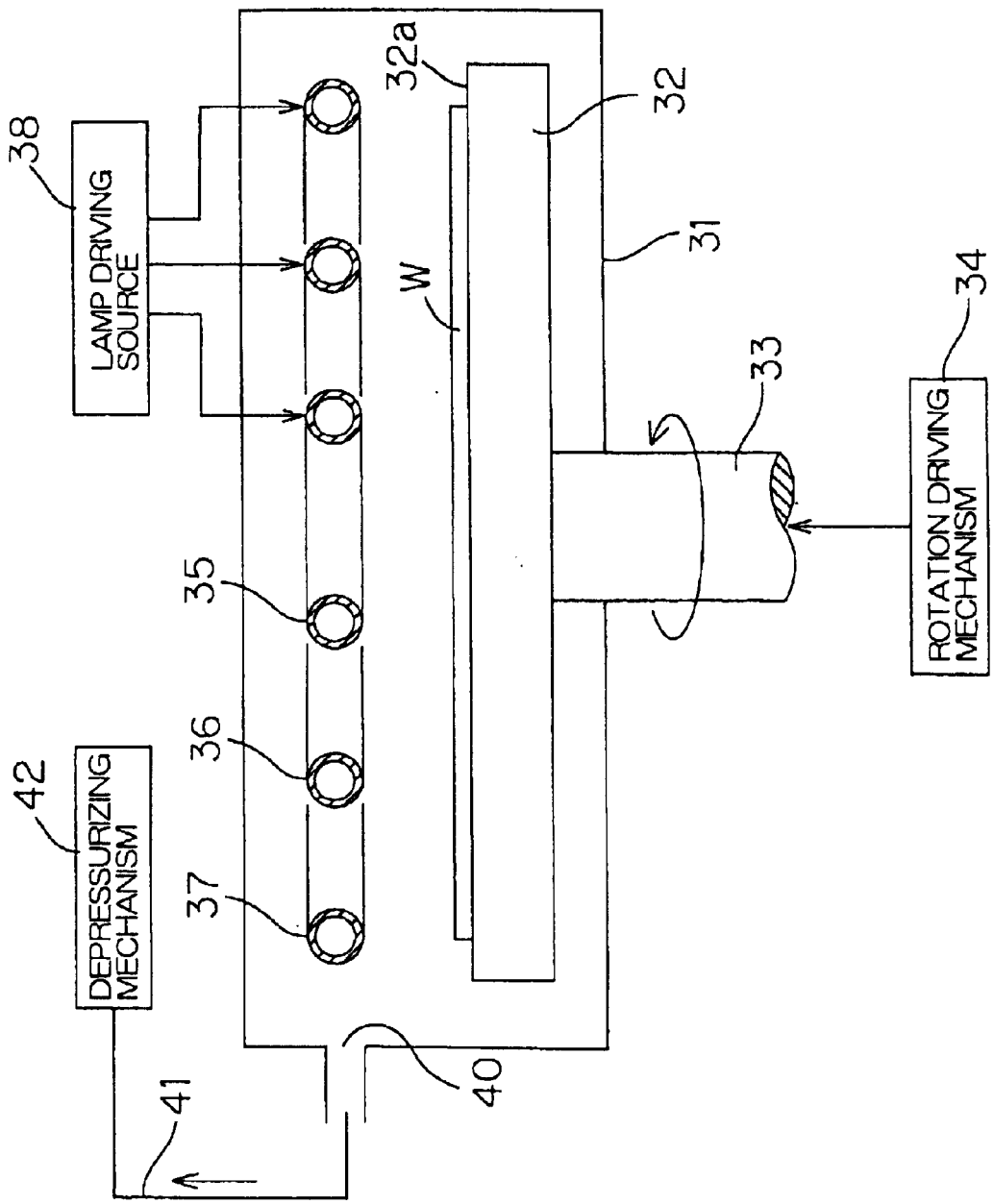
FIG. 3 is a diagram showing an example arrangement of an annealing system used in first and second embodiments.

FIG. 3 is a diagram showing an example arrangement of an annealing system (RTA: Rapid Thermal Anneal) used in the organic substance removing treatment (Step S45). The annealing system is provided with a wafer holder 32 inside a chamber 31. The wafer holder 32 has a substantially level wafer holding surface 32a on its top surface, onto which a wafer W (the one having undergone the manufacturing sequence up to Step S44 in FIG. 2) forming the semiconductor substrate 1 is held. The wafer holder 32 is composed of a plate body attached to the top end of a rotation axis 33 provided along the vertical direction, and driven to rotate around a vertical rotation axial line while holding the wafer W in association with rotation of the rotation axis 33 driven by a rotation driving mechanism 34.

In the interior of the chamber 31, a plurality of toroidal infrared lamps 35, 36 and 37 each having a different diameter are provided almost concentrically at a position opposing the wafer holding surface 32a of the wafer holder 32. These infrared lamps 35, 36, and 37 are supplied with power from a lamp driving source 38, and emit infrared rays toward the wafer W, thereby forming heating means for heating the wafer W.

The chamber 31 is provided with an outlet 40. The outlet 40 is connected to a depressurizing mechanism 42 composed of a vacuum pump or the like through a low-pressure tube 41.

With the above arrangement, when the organic substance removing treatment is carried out, the wafer W is held onto the wafer holder 32, and under these conditions, the depressurizing mechanism 42 is driven while the wafer holder 32 is driven to rotate by the rotation driving mechanism 34, whereby the internal pressure of the chamber 31 is reduced to approximately 50 Torr. Further, power is supplied to the infrared lamps 35, 36, and 37 from the lamp driving source 38, and the wafer W is heated. As a result, the wafer W is heated rapidly to approximately 550° C., and maintained at the raised temperature for 1 second to several minutes. Thereafter, a supply of the power from the lamp driving source 38 to the infrared lamps 35, 36 and 37 is cut to stop heating. By performing the foregoing annealing in a low-pressure atmosphere, organic substances contained in the organic compound materials that will be made into a ferroelectric film are sucked up, whereby a film made of inorganic compound material is formed.

Figure 4:
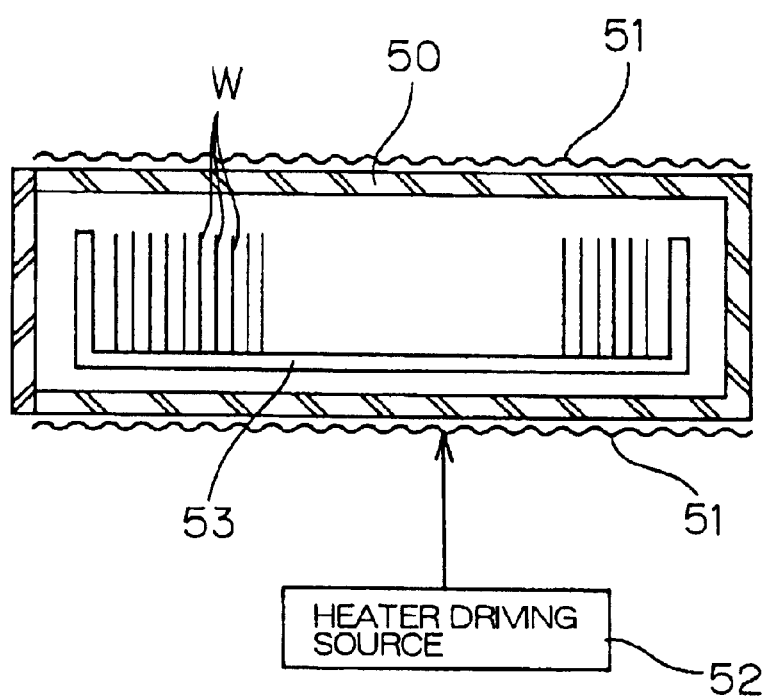
FIG. 4 is a diagram showing an example arrangement of an annealing system used in a post calcining step in the first embodiment.

FIG. 4 is a diagram showing an example arrangement of an annealing system used in the post calcining step (Step S46). The annealing system includes a quartz furnace 50, a heater 51 for heating inside the furnace 50, a heater driving section 52 for supplying power to the heater 51, and a wafer holder 53 for holding a plurality of wafers W collectively inside the furnace 50. With this arrangement, the wafer W having undergone the organic substance removing treatment is placed in the furnace 50, and heated by energizing the heater 51. The heating at this point is carried out in such a manner that the wafer W is heated to approximately 550° C. for 30 minutes.

Because the crystallization-inhibiting factors have been removed as a result of the organic substance removing treatment (Step S45), it is possible to crystallize the ferroelectric film by furnace heating at a relatively low temperature.

Figure 5:
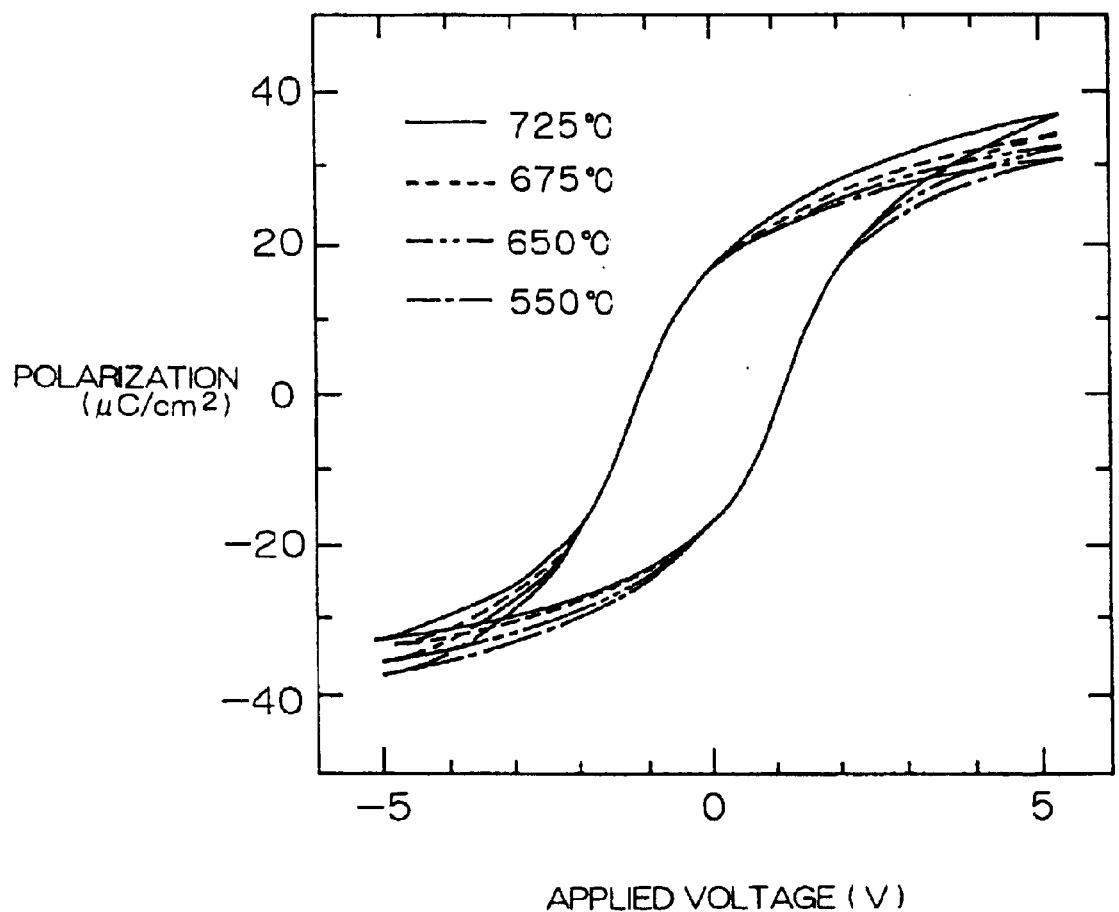
FIG. 5 is a characteristics diagram showing a measurement result of polarization saturation characteristics of the ferroelectric films formed by varying post calcining temperatures.

FIG. 5 is a characteristics diagram showing a measurement result of polarization saturation characteristics of the ferroelectric films 10 in cases that the post calcining temperatures were 550° C., 650° C., 675° C., and 725° C., respectively. It can be understood from this characteristics diagram that there is no significant difference in the polarization saturation characteristics among the ferroelectric films 10 calcined at their respective temperatures, and that calcining at a low temperature (approximately 550° C.) can induce a satisfactory polarization.

Figure 6:
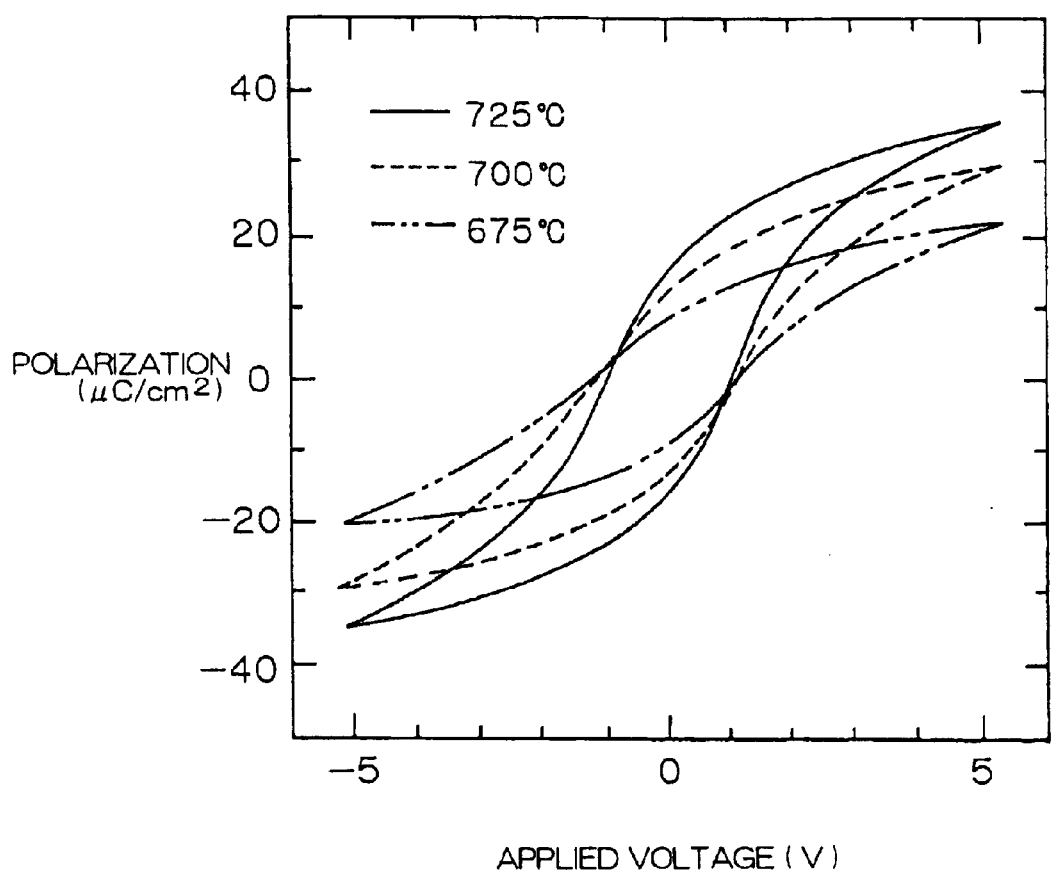
FIG. 6 is a characteristics diagram showing a measurement result of polarization saturation characteristics of the ferroelectric films formed by a conventional method that carries out post calcining without an organic substance removing process.

FIG. 6 is a characteristics diagram showing a measurement result of polarization saturation characteristics of a ferroelectric film formed by the conventional method, by which post calcining is carried out without the organic substance removing treatment. FIG. 6 shows the measurement result in the cases where the post calcining temperatures were 675° C., 700° C., and 725° C., respectively. It can be understood from FIG. 6 that the polarization characteristics depend largely on the calcining temperatures, and desired polarization characteristics cannot be achieved unless the annealing at a temperature as high as 700° C. or above is carried out.

Figure 7:
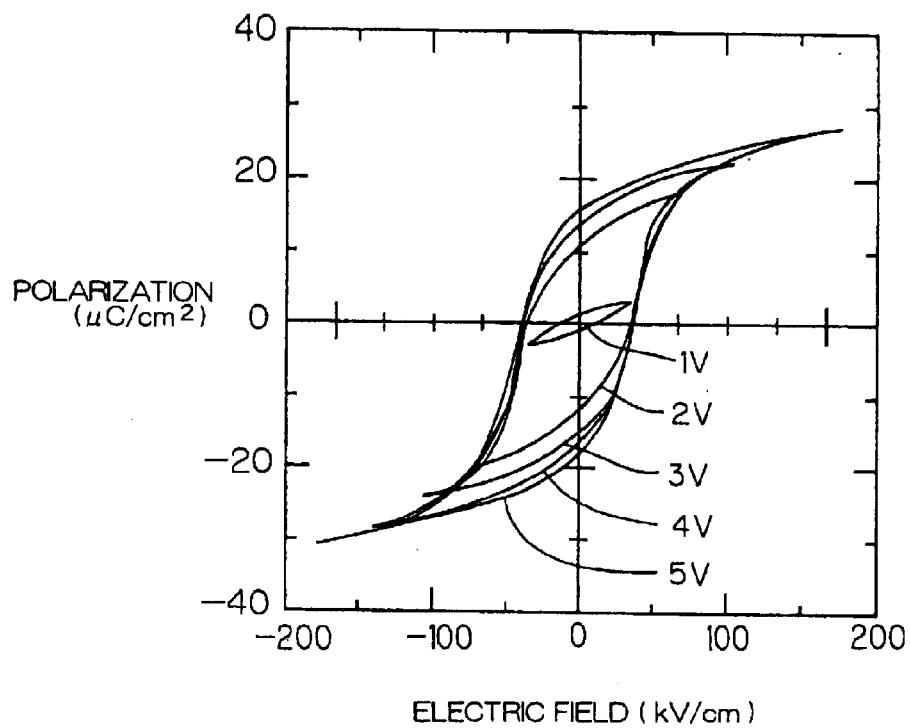
FIG. 7 is a characteristics diagram showing a change of polarization when inversion electric fields of different intensities are applied.

FIG. 7 shows polarization saturation characteristics when the organic substance removing treatment was carried out under a reduced pressure of approximately 50 Torr and a temperature of approximately 550° C., after which the ferroelectric film was crystallized by furnace heating at approximately 550° C., thereby indicating a change of polarization when inversion electric fields with various intensities were applied. Each curve is shown with their respective applied voltage values.

Figure 8:
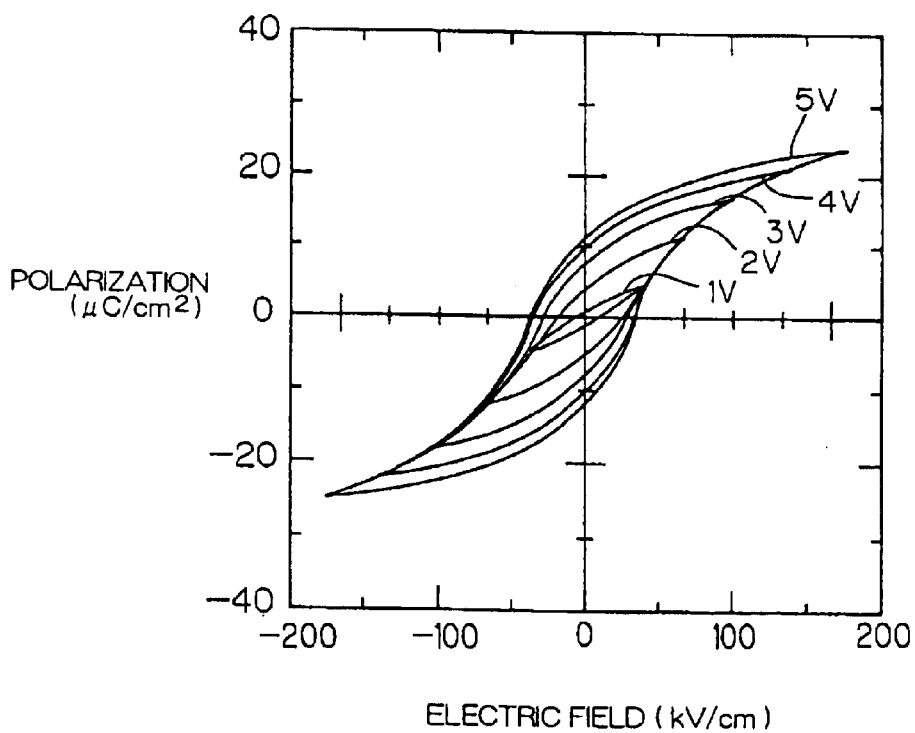
FIG. 8 is a characteristics diagram showing a change of polarization in response to applied electric fields of different intensities in a ferroelectric film formed by a prior art method without an organic substance removing process.

Also, FIG. 8 shows similar polarization saturation characteristics of a ferroelectric film formed by the prior art, by which the post calcining was carried out at approximately 760 Torr (atmospheric pressure) and 650° C. without the organic substance removing treatment. Each curve is shown with their respective applied voltage values.

It is understood from comparison between FIGS. 7 and 8 that the ferroelectric film formed by the method of the present embodiment shows satisfactory polarization characteristics regardless of a relatively low post calcining temperature. Also, it is understood that the ferroelectric film formed by the method of the present embodiment is able to induce a large polarization upon application of a weak electric field. Therefore, a ferroelectric memory employing this ferroelectric film is allowed to carry out writing/erasing action in a satisfactory manner when driven on a low voltage.

Figure 9:
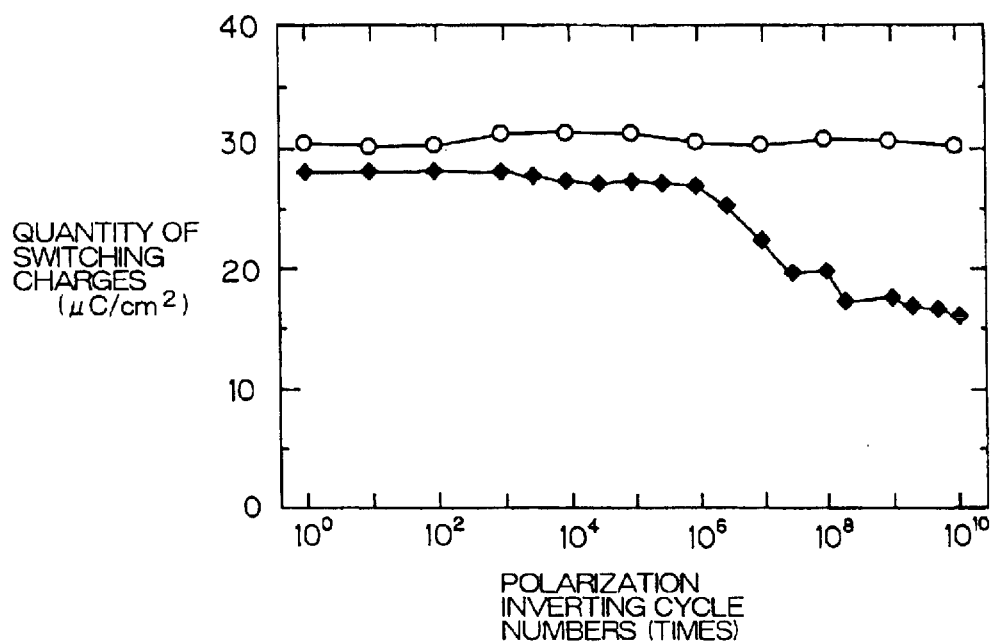
FIG. 9 is a diagram showing film fatigue characteristics of the ferroelectric film.

FIG. 9 is a view showing film fatigue characteristics of the ferroelectric film. It shows similar polarization saturation characteristics of a ferroelectric film formed by the prior art, by which the post calcining was carried out at approximately 760 Torr (atmospheric pressure) and 650° C. without the organic substance removing treatment. It shows similar polarization saturation characteristics of a ferroelectric film formed by the prior art, by which the post calcining was carried out at approximately 760 Torr (atmospheric pressure) and 650° C. without the organic substance removing treatment. FIG. 9 shows a change in quantity of switching charges with the number of polarization inversion cycles when a polarization inversion voltage is applied repetitively. The film fatigue characteristics of the ferroelectric film of the present embodiment are indicated by an open symbol ○ and the film fatigue characteristics of the ferroelectric film of the prior art calcined at approximately 650° C. and 760 Torr (atmospheric pressure) without the organic substance removing treatment were indicated by a solid symbol ♦.

Figure 10:
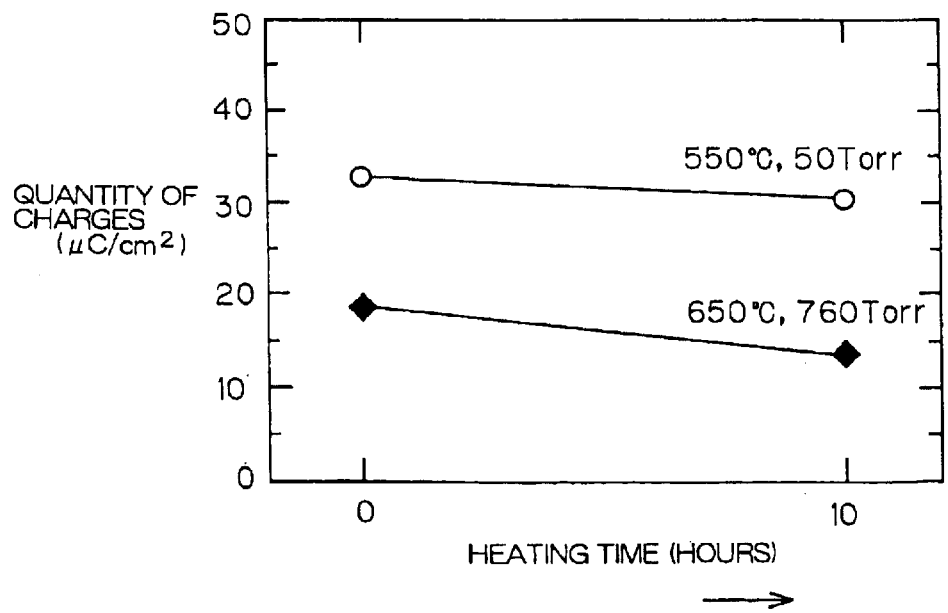
FIG. 10 is a diagram showing data holding characteristics of the ferroelectric film.

It is understood from FIG. 9 that the ferroelectric film formed in the present embodiment excels the ferroelectric film formed by the conventional method markedly in the film fatigue characteristics. Consequently, it is possible to achieve a ferroelectric memory with rewritable number of times far greater than the conventionally achievable number of times. FIG. 10 shows data holding characteristics of the ferroelectric film. It shows a measured value of a quantity of charges appearing on the ferroelectric film when an inverting electric field was applied to the ferroelectric film having undergone $10^8$ times of polarization inversion cycles, and a measured value of the similar measurement 10 hours after an acceleration test had been conducted subsequently at approximately 150° C. while applying the electric field in one direction. As was with FIG. 9, the result of measurement of the ferroelectric film formed according to the present embodiment is indicated by an open symbol ○ and the result of measurement of the ferroelectric film formed by the conventional method is indicated by a solid symbol ♦.

It is understood from FIG. 10 that the ferroelectric film formed according to the present embodiment is able to hold the polarization state far longer than the ferroelectric film formed by the conventional method. Thus, in view of the foregoing, it is understood that a ferroelectric memory with satisfactory data holding characteristics can be achieved.

In this manner, the organic substances can be removed from the organic compound materials by heat treatment at a low pressure. Then, by carrying out the post calcining step under these conditions to crystallize the ferroelectric film 10, it is possible to obtain the satisfactorily crystallized ferroelectric film 10 even if a temperature in the post calcining step is relatively low. Hence, there neither occurs characteristics deterioration of the transistor TR nor characteristics deterioration resulted from mutual-diffusion of materials of the ferroelectric film 10 and each film adjacent to the same, thereby making it possible to enhance various characteristics. As a result, it is possible to achieve a ferroelectric memory with far excellent characteristics compared with the conventional ferroelectric memory.

Figure 11:
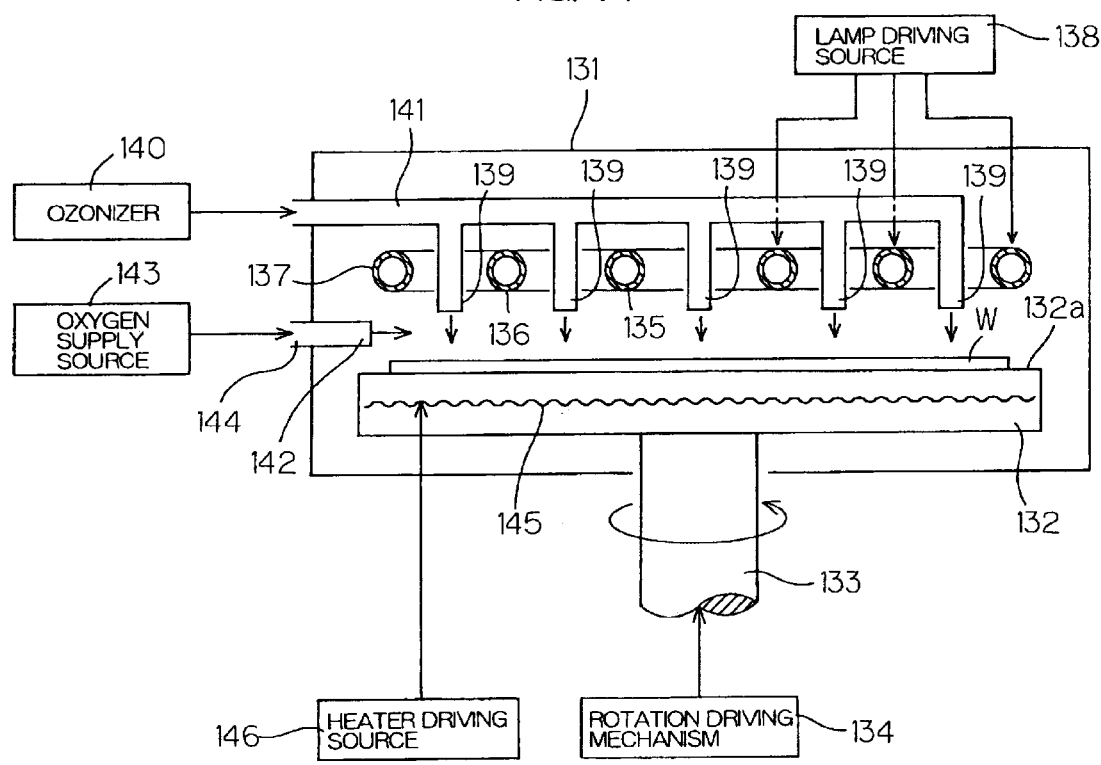
FIG. 11 is a diagram showing an arrangement of a treatment system for carrying out a restoring step.

FIG. 11 is a diagram showing an example arrangement of a treatment system for carrying out the restoring step mentioned above. The treatment system is provided with a wafer holder 132 inside a chamber 131. The wafer holder 132 has a substantially level wafer holding surface 132a on its top surface, onto which a wafer W (the one having undergone the manufacturing sequence from Steps S1 through S10 in FIG. 1) forming the semiconductor substrate 1 is held. The wafer holder 132 is composed of a plate body attached to the top end of a rotation axis 133 provided along the vertical direction, and driven to rotate around a vertical rotational axial line while holding the wafer W in association with the rotation of the rotation axis 133 driven by a rotation driving mechanism 134.

The wafer holder 132 encloses a heater 145. The heater 145 generates heat upon supply of power from a heater driving source 146, thereby forming heating means for heating the wafer W held onto the wafer holding surface 132a.

In the interior of the chamber 131, a plurality of toroidal UV lamps 135, 136 and 137 each having a different diameter are provided almost concentrically at a position opposing the wafer holding surface 132a of the wafer holder 132. These UV lamps 135, 136, and 137 form UV ray treatment means (non-annealing means, that is, treatment means using energy other than thermal energy) for emitting UV rays toward the wafer W upon supply of power from a lamp driving source 138.

Figure 12:
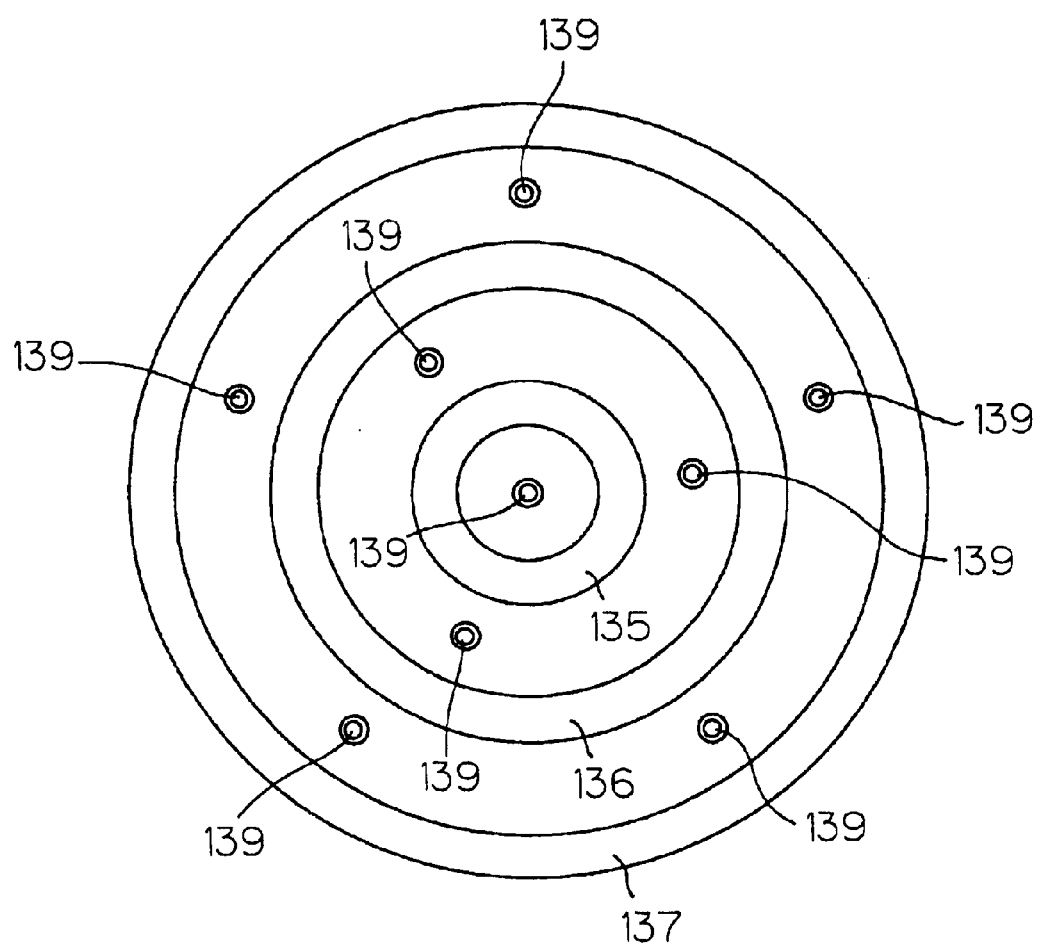
FIG. 12 is a schematic bottom view schematically showing alignment of UV lamps and ozone outlets.

FIG. 12 is a bottom view of the UV lamps 135, 136, and 137. A plurality of ozone outlets 139 are provided at positions apart from the positions where the UV lamps 135, 136, and 137 are provided in such a manner so as to oppose the wafer W held onto the wafer holding surface 132a. The ozone outlets 139 are supplied with ozone generated by an ozonizer 140 (see FIG. 11) via an ozone supply tube 141. In short, the ozone outlets 139, ozonizer 140, and ozone supply tube 141 form ozone treatment means as one type of oxygen activated particle treatment means.

Further, in the interior of the chamber 131, an oxygen 291 outlet 142 for supplying an oxygen gas to the surface of the wafer W is provided at one side of the wafer holder 132. The oxygen outlet 142 is supplied with oxygen from an oxygen supply source 143 via an oxygen gas supply tube 144.

With the foregoing arrangement, in the restoring step, the wafer W is held onto the wafer holding surface 132a of the wafer holder 132, and under these conditions, the heater 145 is energized by the heater driving source 146 (annealing step) while the UV lamps 135, 136, and 137 are energized by the lamp driving source 138 (electromagnetic wave supplying step, that is, a treatment step using energy other than heat). As a result, the wafer W is supplied with thermal energy and the annealing is initiated, while at the same time, the wafer W is supplied with energy of UV rays and the non-annealing (non-thermal energy treatment: a treatment using energy other than heat) is initiated.

In the restoring step, ozone is supplied further to the surface of the wafer W through the ozone outlets 139 from the ozonizer 140 via the ozone supply tube 141 (oxygen activated particle treatment step), and an oxygen gas as a oxidation gas is supplied from the oxygen gas supply source 143 via the oxygen gas supply tube 144 (oxygen introducing step). As a result, the non-annealing is carried out on the wafer W upon supply of energy from ozone. In addition, because the wafer W is placed in an oxygen atmosphere, the oxidation reaction can proceed in a satisfactory manner.

While the wafer W is treated, the rotation driving mechanism 134 is energized constantly, so that the wafer holder 132 holding the wafer W is kept rotated. This makes it possible to irradiate UV rays from the UV lamps 135, 136, and 137 evenly, and supply the ozone and oxygen gas homogeneously across the wafer W.

Energizing of the heater 145 by the heater driving source 146 is controlled in such a manner that the wafer W is heated to approximately 400° C., at or below which the aluminum wires 9 and 17 (see FIG. 16) will not melt. This annealing at a relatively low temperature alone cannot fully restore the characteristics deterioration of the ferroelectric film 10 caused in each of Steps S5 through S10 in FIG. 1. However, in the present embodiment, because a shortage of energy can be compensated by irradiation of UV rays and supply of ozone, the characteristics of the ferroelectric film 10 can be restored in a satisfactory manner.

Figure 13:
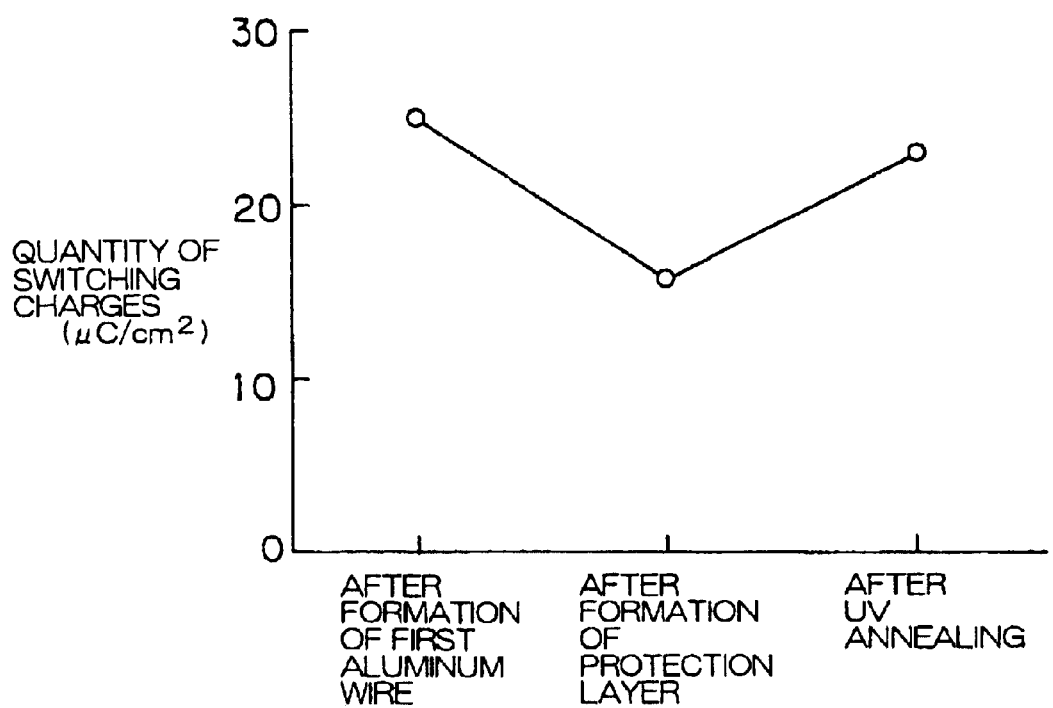
FIG. 13 is a graph showing an example measurement value of a quantity of switching charges (residual polarization) in the ferroelectric film.

FIG. 13 is a graph showing an example measured value of a quantity of switching charges (residual polarization) in the ferroelectric film 10. A quantity of switching charges was measured with the ferroelectric memory having the cell structure shown in FIG. 16 in each of the following states: after the first aluminum wire 9 was formed (a state before the following steps of forming the third interlayer insulation film 16 and the like); after the second aluminum wire 17 and protection film 19 were formed (a state before the restoring step); and after the restoring step mentioned above (UV annealing) was carried out.

It is understood from the graph in FIG. 13 that a quantity of the switching charges, which is important characteristics of the ferroelectric film 10, drops by the step after forming the first aluminum wire 9. However, this characteristics deterioration can be restored to approximately 90% by the restoring step mentioned above.

In this manner, according to the present embodiment, in the restoring step of restoring characteristics deterioration of the ferroelectric film 10, by supplying the wafer W with energy other than heat, that is, UV rays energy and ozone as the oxygen activated particles, the function as the ferroelectric film 10 can be restored with small thermal energy. This makes it possible to restore the function as the ferroelectric film 10 by the treatment at a low temperature such that does not melt the first and second aluminum wires 9 and 17. Consequently, there can be achieved a ferroelectric memory employing the ferroelectric film 10 having satisfactory capacitor characteristics and polarization characteristics. Moreover, because the ferroelectric film 10 can restore its function by the treatment at a low temperature, damages are hardly given to the impurity diffusion layers 3 and 4 formed in the semiconductor substrate 1, which also makes it possible to enhance the characteristics of the ferroelectric memory.

Next, the following description will describe a method in accordance with a second embodiment of the present invention with reference to FIG. 3 again.

In the second embodiment, the organic substance removing step and post calcining step are carried out almost simultaneously. More specifically, with the annealing system shown in FIG. 3, the wafer holder 32 holding the wafer W is rotated by the rotation driving mechanism 34. At the same time, the wafer W is heated by supplying the infrared lamps 35, 36, and 37 with power from the lamp driving source 38. Then, the depressurizing mechanism 42 is activated, so that the internal pressure of the chamber 31 is reduced to approximately 50 Torr, for example.

Heating by the infrared lamps 35, 36, and 37 is carried out at a sufficiently high temperature (for example, approximately 550° C.) and a sufficiently long time (for example, approximately 30 minutes) to crystallize the ferroelectric film 10 formed on the wafer W.

In a period at the beginning of the heating, because the materials of the ferroelectric film 10 include residual organic substances, film crystallization is inhibited. However, as the organic substances are removed as they evaporate in the depressurized chamber 31, the film crystallization starts. By continuing to heat the wafer W as long as necessary, the ferroelectric film 10 crystallized all across can be obtained.

In this manner, the present embodiment is characterized by carrying out the organic substance removing step and post calcining step almost simultaneously (or in succession) by a single treatment system, and as a consequence, not only can the number of steps be reduced, but also the production costs can be saved.

Figure 14:
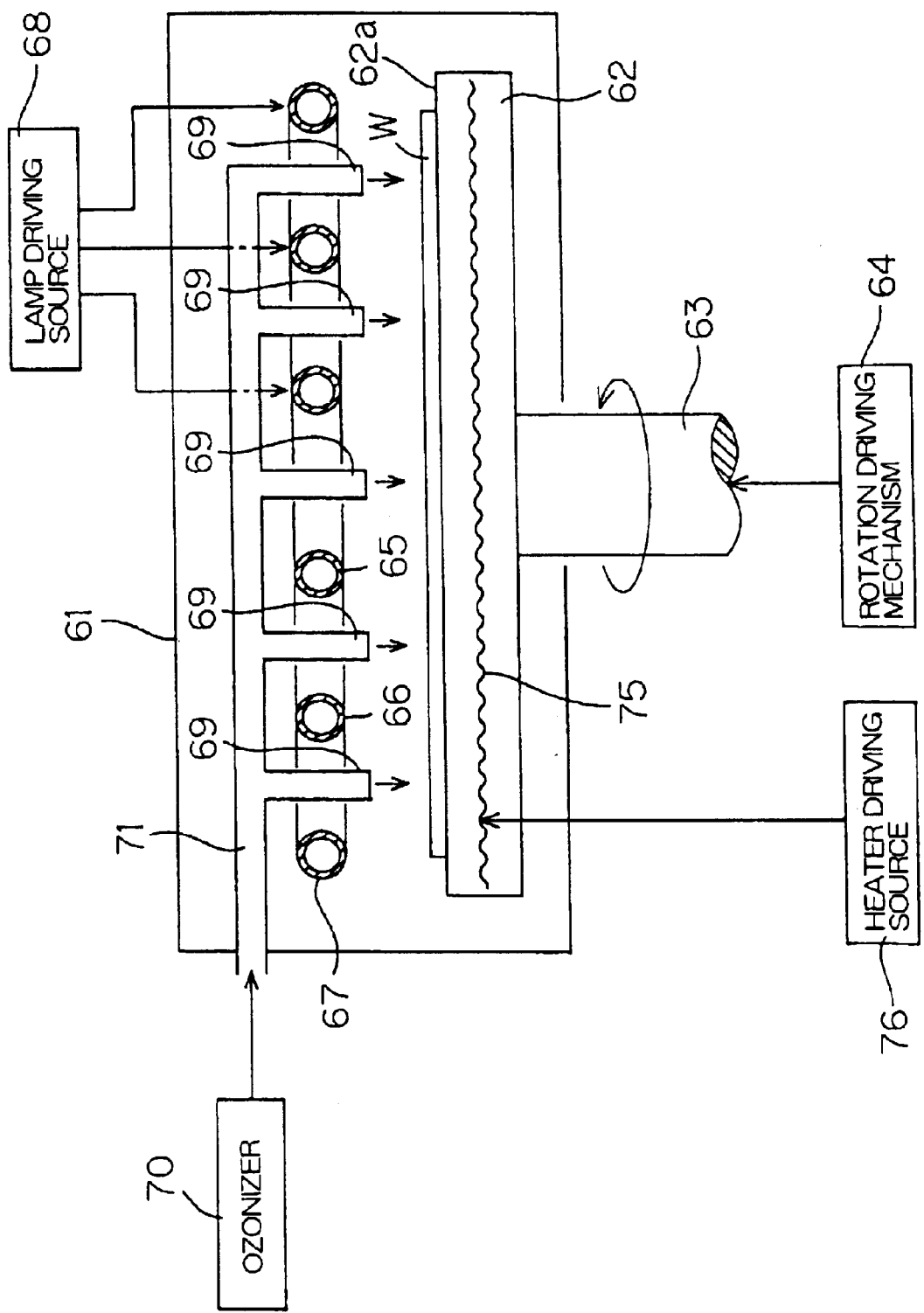
FIG. 14 is a diagram showing an example arrangement of a treatment system used for an organic substance removing treatment in a third embodiment of the present invention.

FIG. 14 is a diagram showing an example arrangement of a treatment system used for the organic substance removing treatment in a third embodiment of the present invention. The treatment system is provided with a wafer holder 62 inside a chamber 61. The wafer holder 62 has a substantially level wafer holding surface 62a on its top surface, onto which a wafer W (the one having undergone the manufacturing sequence up to Step S44 in FIG. 2) forming the semiconductor substrate 1 is held. The wafer holder 62 is composed of a plate body attached to the top end of a rotation axis 63 provided along the vertical direction, and driven to rotate around a vertical rotation axial line while holding the wafer W in association with the rotation of the rotation axis 63 driven by a rotation driving mechanism 64.

The wafer holder 62 encloses a heater 75. The heater 75 generates heat upon supply of power from a heater driving source 76, thereby forming annealing means for heating the wafer W held onto the wafer holding surface 62a.

In the interior of the chamber 61, a plurality of toroidal UV lamps 65, 66 and 67 each having a different diameter are provided concentrically or almost concentrically at a position opposing the wafer holding surface 62a of the wafer holder 62. These UV lamps 65, 66, and 67 form UV ray treatment means for emitting UV rays toward the wafer W upon supply of power from a lamp driving source 68.

Figure 15:
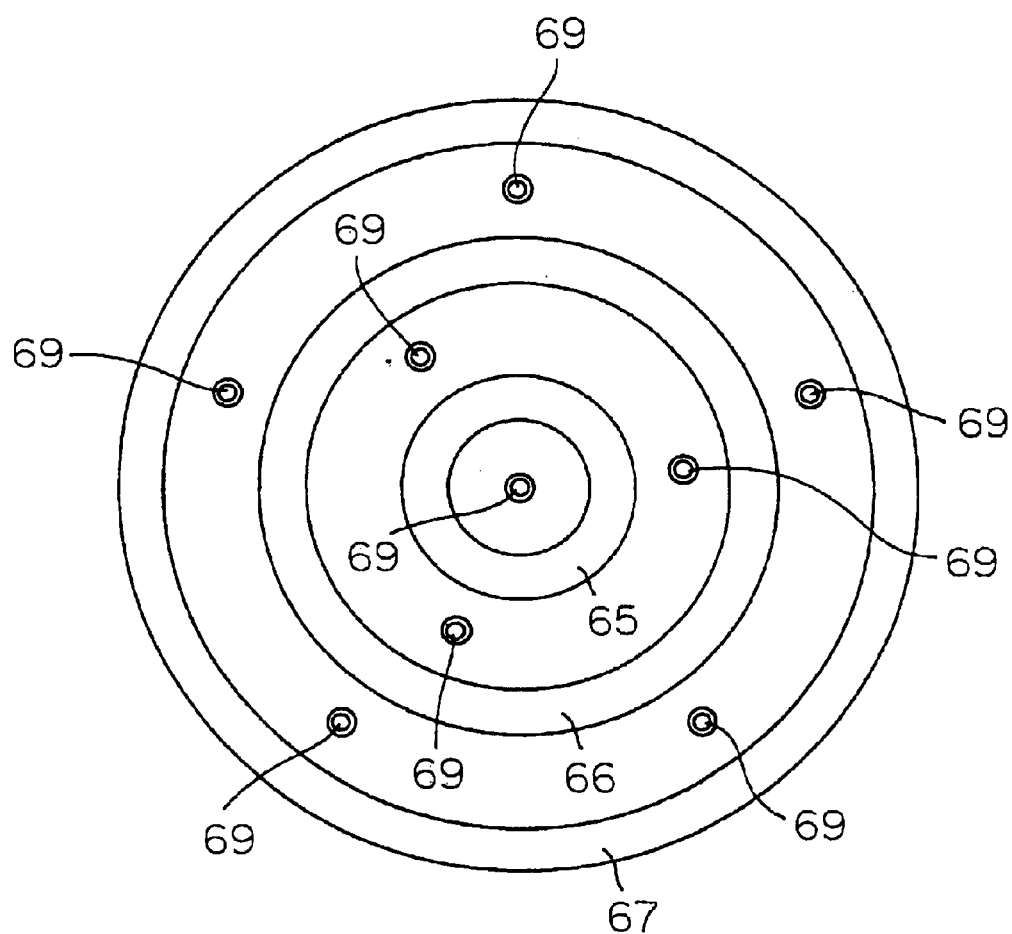
FIG. 15 is a bottom view of UV lamps, etc. in the system of FIG. 14.

FIG. 15 is a bottom view of the UV lamps 65, 66, and 67. A plurality of ozone outlets 69 are provided at positions apart from the positions where the UV lamps 65, 66, and 67 are provided in such a manner so as to oppose the wafer W held onto the wafer holding surface 62a. The ozone outlets 69 are supplied with ozone generated by an ozonizer 70 (see FIG. 14) via an ozone supply tube 71. In short, the ozone outlets 69, ozonizer 70, and ozone supply tube 71 form ozone treatment means as one type of activated oxygen particle treatment means.

With the above arrangement, in the organic substance removing step (Step S45 in FIG. 2), the wafer W is held onto the wafer holding surface 62a of the wafer holder 62, and under these conditions, the heater 75 is energized by the heater driving source 76 (annealing step). Meanwhile, the UV lamps 65, 66, and 67 are energized by the lamp driving source 68 (electromagnetic wave supplying step, that is, a step of giving energy other than heat). As a result, the wafer W is supplied with thermal energy and annealing is initiated, while at the same time, the wafer W is supplied with energy of the UV rays and non-thermal energy treatment is initiated. As a result, organic substances contained in the organic compound materials are removed.

In the organic substance removing step (Step S45), ozone is supplied further to the surface of the wafer W through the ozone outlets 69 from the ozonizer 70 via the ozone supply tube 71 (activated oxygen particle treatment step). This makes it possible to carry out the non-thermal energy treatment with a supply of energy from ozone at the same time. As a result, the organic substances contained in the organic compound materials can be removed more effectively.

While the wafer W is treated, the rotation driving mechanism 64 is energized constantly, so that the wafer holder 62 holding the wafer W is kept rotated. This makes it possible to irradiate UV rays from the UV lamps 65, 66, and 67 evenly, and supply the ozone and an oxygen gas homogeneously across the wafer W.

Energizing of the heater 75 by the heater driving source 76 is controlled in such a manner that the wafer W is heated to a temperature such that does not cause deterioration of the element characteristics of the transistor TR and mutual-diffusion of materials of the ferroelectric film 10 and each film adjacent to the same.

It should be noted that, in the present embodiment, by reducing an internal pressure of the chamber 61 with a depressurizing mechanism, the organic substances can be removed more effectively.

Following the organic substance removing step, the post calcining step (Step S46 in FIG. 2) is carried out by furnace heating using the annealing system arranged in the manner shown in FIG. 4.

As has been discussed, according to the present embodiment, by giving the UV ray energy and ozone as the activated oxygen particles to the organic compound materials, the organic substance removing treatment can be achieved. Consequently, thermal stress to the transistor TR or the like can be lessened, thereby contributing to enhance the characteristics of the ferroelectric memory.

The above description has described three embodiments. It should be appreciated, however, that the present invention can be implemented in other embodiments. For example, in the third embodiment above, while the wafer W is heated, the UV rays are irradiated and ozone is supplied at the same time in the organic substance removing step. However, only one of the heating of the wafer W, UV ray irradiation, and supply of ozone can be carried out, or only two of them can be combined arbitrary.

In addition, in the embodiments discussed above, the explanation is given in the case where the ferroelectric film 10 is formed by the sol-gel method incorporating each of the organic substance removing treatment and post calcining step at a low temperature. However, the restoring step discussed above is applicable to a ferroelectric film formed by the conventional sol-gel method, by which the post calcining step is carried out at high temperatures (600° C. to 725° C., in particular, 700° C. or above) without the organic substance removing treatment.

Also, the ferroelectric film 10 can be formed by other methods including, sputtering method, MOCVD (Metal Organic Chemical Vapor Deposition) method, MOD (Metal Organic Decomposition) method, pulse laser deposition method, ion beam sputtering method, etc., and the restoring step discussed above may be applied to the ferroelectric film formed in any of the foregoing methods.

Further, in the embodiments discussed above, in the restoring step, both the irradiation of UV rays and supply of ozone are carried out simultaneously with the heating of the wafer W. However, either the irradiation of UV rays or supply of ozone alone may be carried out. Also, in the embodiments discussed above, an oxygen atmosphere is given as the atmosphere for the wafer W in the restoring step. However, in case that characteristics deterioration caused by stress applied to the ferroelectric film 10 is the main problem, and restoration of the characteristics deterioration of the ferroelectric film 10 caused by a reduction reaction is less important, the atmosphere of the wafer W is not necessarily an oxygen atmosphere (oxidation gas atmosphere).

In addition, in the embodiments discussed above, the explanation is given as to an arrangement such that annealing of the wafer W is carried out by transferring the heat generated by the heater 45 enclosed in the wafer holder 32 to the wafer W. However, an arrangement such that the wafer W is heated by radiant heat generated from an infrared lamp or the like is also applicable.

Further, in the embodiments discussed above, the explanation is given as to the case where the ferroelectric memory is manufactured. However, the present invention can be adapted in manufacturing semiconductor devices of the other kinds including, a device exploiting the characteristics of the ferroelectric capacitor, a DRAM using high dielectric constant materials (for example, BST (BaSr)TiO$_3$ or the like), each kind of sensors using a piezoelectric (ZrO or the like) or a pyroelectric, etc.

While embodiments of the present invention have been described in detail, such description is for illustrative purpose only in order to clarify an essence of the present invention, and the invention is not limited to these embodiments and construed as such, and the spirit and scope of the present invention is to be determined solely by the appended claims.

This application is based on Japanese Patent Application No. 10-337323 filed on Nov. 27, 1998 and Japanese Patent Application 10-370807 filed on Dec. 25, 1998, thereby claiming the priority of these applications under the convention, the entire contents of which being incorporated herein by reference.

INDUSTRIAL APPLICABILITY

As has been discussed, the present invention is usable to form an inorganic compound solid represented by a ferroelectric film employed in a ferroelectric memory, and further, adapted to manufacture a semiconductor device represented by a ferroelectric memory.

What is claimed is:

1. A method of forming a solid of a ferroelectric or a high dielectric material by calcining organic compounds containing metal elements, comprising:

a step of forming a film by coating over a substrate a solution of an organic compound material containing a metal element;

an organic substance removing step of removing organic substances from the film by applying an organic substance removing treatment to the organic compound material containing the metal elements, thereby obtaining an inorganic compound material; and a crystallizing step of calcining to crystallize the inorganic compound material obtained in said organic substance removing step, thereby obtaining a solid of a ferroelectric or a high dielectric material;

the organic substance removing step including a depressurizing step of placing the organic compound material in a low-pressure atmosphere and a heat treatment step of heating the organic compound material at a temperature at which the organic compound material does not crystallize, the depressurizing step and the heat treatment step being performed simultaneously.

2. The method of forming solid of a ferroelectric or a high dielectric material according to claim 1, wherein said crystallizing step is carried out after said depressurizing step.

3. The method of forming solid of a ferroelectric or a high dielectric material according to claim 1, wherein said depressurizing step and crystallizing step are carried out simultaneously by calcining the organic compound material in the low-pressure atmosphere.

4. A method of forming a solid of a ferroelectric or a high dielectric material by calcining organic compounds containing metal elements, comprising:

a step of forming a film by coating over a substrate a solution of an organic compound material containing a metal element;

an organic substance removing step of removing organic substances from the film by applying an organic substance removing treatment to the organic compound material containing metal element, thereby obtaining an inorganic compound material; and a crystallizing step of calcining to crystallize the inorganic compound material obtained in said organic substance removing step, thereby obtaining a solid of a ferroelectric or a high dielectric material;

the organic substance removing step including an electromagnetic wave supplying step of supplying an electromagnetic wave to the organic compound material and a heat treatment step of heating the organic compound material at a temperature at which the organic compound material does not crystallize, the electromagnetic wave supplying step and the heat treatment step being performed simultaneously.

5. A method of forming a solid of a ferroelectric or a high dielectric material by calcining organic compounds containing metal elements, composing:

a step of forming a film by coating over a substrate a solution of an organic compound material containing a metal element;

an organic substance removing step of removing organic substances from the film by applying an organic substance removing treatment to the organic compound material containing a metal element, thereby obtaining an inorganic compound material; and a crystallizing step of calcining to crystallize the inorganic compound material obtained in said organic substance removing step, thereby obtaining a solid of a ferroelectric or a high dielectric material;

the organic substance removing step including a step of treating the organic compound materials with activated oxygen particles and a heat treatment step of heating the organic compound material at a temperature at which the organic compound material does not crystallize, the activated oxygen particle treatment step and the heat treatment step being performed simultaneously.

6. The method of forming a solid of a ferroelectric or a high dielectric material according to claim 1, wherein the solid of a ferroelectric or a high dielectric material is a complex oxide.

7. A method of manufacturing a semiconductor device, comprising a step of forming, on a semiconductor substrate, a functional thin film made of a solid of a ferroelectric or a high dielectric material formed by the method according to claim 1.

8. The method of manufacturing a semiconductor device according to claim 7, further comprising:

a restoring step of restoring characteristics deterioration of the functional thin film caused by influences in a step carried out after the functional thin film is formed, said restoring step including:

a treatment step of giving energy other than heat to the functional thin film; and a heat treatment step of giving thermal energy to the functional thin film.

9. The method of manufacturing a semiconductor device according to claim 8, wherein said restoring step further includes an oxygen introducing step of introducing an oxidation gas to a surface of the semiconductor substrate having formed thereon the functional thin film.

10. The method of manufacturing a semiconductor device according to claim 8, wherein said treatment step of giving energy other than heat to the functional thin film includes an oxygen activated particle treatment step of placing the semiconductor substrate having formed thereon the functional thin film in an oxygen activated particle atmosphere.

11. The method of manufacturing a semiconductor device according to claim 8, wherein said treatment step of giving energy other than heat to the functional thin film includes an electromagnetic wave supplying step of supplying an electromagnetic wave to the functional thin film.

12. The method of manufacturing a semiconductor device according to claim 8, further comprising a wire forming step of forming a wiring on the semiconductor substrate before said restoring step.

13. The method of manufacturing a semiconductor device according to claim 12, wherein said heat treatment step is carried out such that a temperature of the semiconductor substrate does not exceed a certain temperature predetermined so as not to deteriorate the wiring.

14. The method of manufacturing a semiconductor device according to claim 8, further comprising an element forming step of forming a functional element on the semiconductor substrate before said restoring step.

15. The method of manufacturing a semiconductor device according to claim 14, wherein said heat treatment step is carried out such that a temperature of semiconductor substrate does not exceed a certain temperature predetermined so as not to deteriorate the functional element.

16. The method of manufacturing a semiconductor device according to claim 7, comprising an element forming step of forming a functional element on the semiconductor substrate before said step of forming the functional thin film.

17. The method of manufacturing a semiconductor device according to claim 16, wherein said crystallizing step is carried out at or below a certain temperature predetermined so as not to deteriorate characteristics of the functional element.

18. The method of manufacturing a semiconductor device according to claim 7, wherein said crystallizing step is carried out at a predetermined temperature lower than a temperature, at or above which mutual-diffusion of materials occurs between the functional thin film and a solid adjacent thereto.

19. The method of manufacturing a semiconductor device according to claim 7, wherein:

the functional thin film is a ferroelectric thin film; and the semiconductor device is a ferroelectric storage device employing the ferroelectric thin film as a charge holding film.

20. The method of forming a solid of a ferroelectric or a high dielectric material according to claim 1, wherein said step of forming the film includes a step of performing precalcining after the solution coated on the substrate is dried.

21. The method of forming a solid of a ferroelectric or a high dielectric material according to claim 5, wherein the activated oxygen particles include oxygen radical.

* * * * *